United States Patent [19]

Stroupe et al.

[11] 4,054,348
[45] Oct. 18, 1977

[54] ELECTRICAL CONNECTOR

[75] Inventors: John R. Stroupe, Cambridge; Kenneth L. Shooter, Senecaville, both of Ohio

[73] Assignee: NCR Corporation, Dayton, Ohio

[21] Appl. No.: 709,740

[22] Filed: July 29, 1976

[51] Int. Cl.² .................. H01R 13/54; H05K 1/04
[52] U.S. Cl. ........................ 339/91 R; 339/17 F; 339/176 MF
[58] Field of Search ........... 339/17 F, 91 R, 176 MF, 339/75 M

[56] References Cited

U.S. PATENT DOCUMENTS

| 3,602,870 | 8/1971 | Willard | 339/17 F |
|---|---|---|---|
| 3,701,071 | 10/1972 | Landman | 339/91 R X |
| 4,023,877 | 5/1977 | Hennessey et al. | 339/17 F |

FOREIGN PATENT DOCUMENTS

| 1,194,539 | 6/1970 | United Kingdom | 339/176 MF |

*Primary Examiner*—Roy Lake
*Assistant Examiner*—E. F. Desmond
*Attorney, Agent, or Firm*—J. T. Cavender; Wilbert Hawk, Jr.; Richard W. Lavin

[57] ABSTRACT

An electrical connector for connecting a flat multiple conductor cable to a printed circuit board comprises a one-piece molded plastic member having a slot for receiving one end of the cable which is positioned adjacent the underside of the connector, the slot providing strain relief for the cable. The connector includes a pair of front mounted tab members insertable in apertures located in the printed circuit board and having feet portion engaging the underside of the printed circuit board. The connector further includes a plurality of rear mounted latching finger members which snap over the edge of the printed circuit board latching the connector to the printed circuit board. An abutment member located on the underside of the connector presses the exposed conductor in the cable against the exposed conductor on the surface of the printed circuit board upon the latching of the connector to the printed circuit board.

15 Claims, 7 Drawing Figures

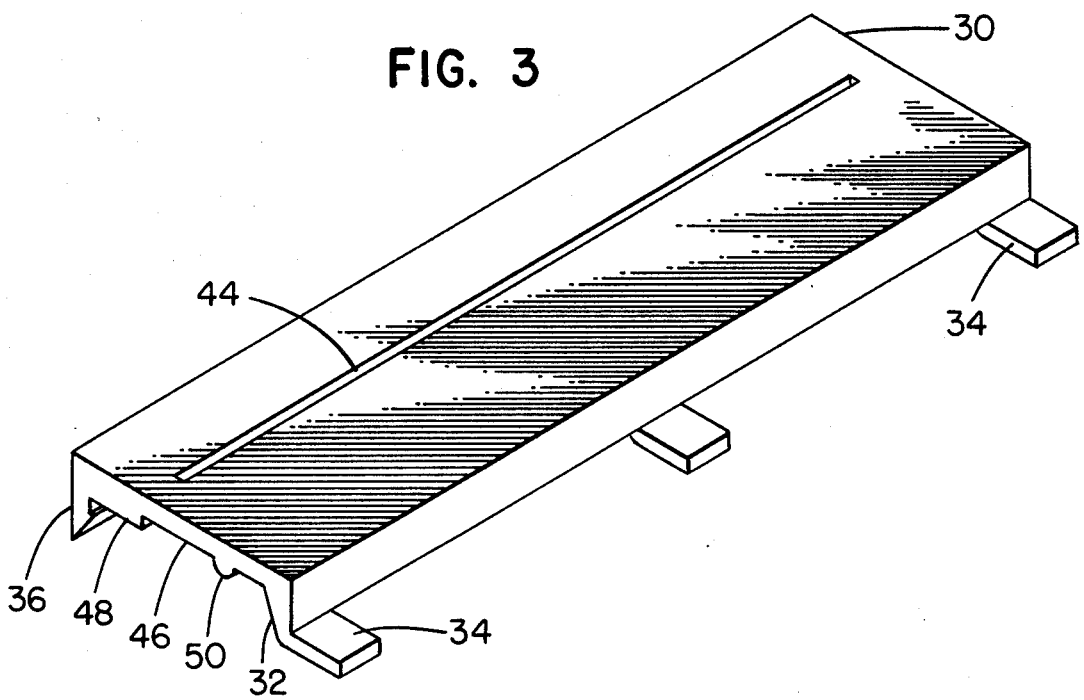
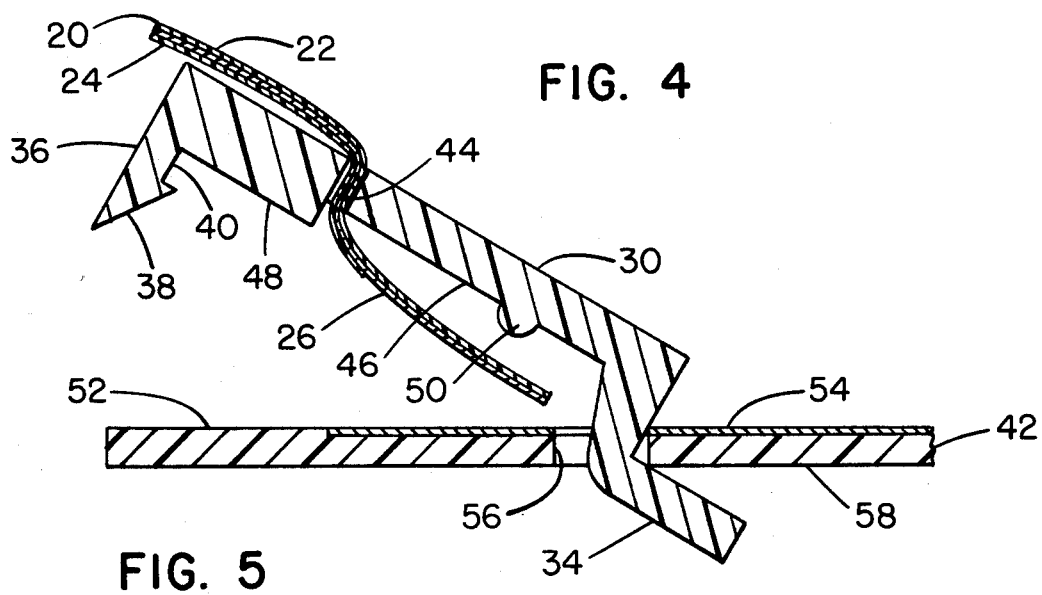
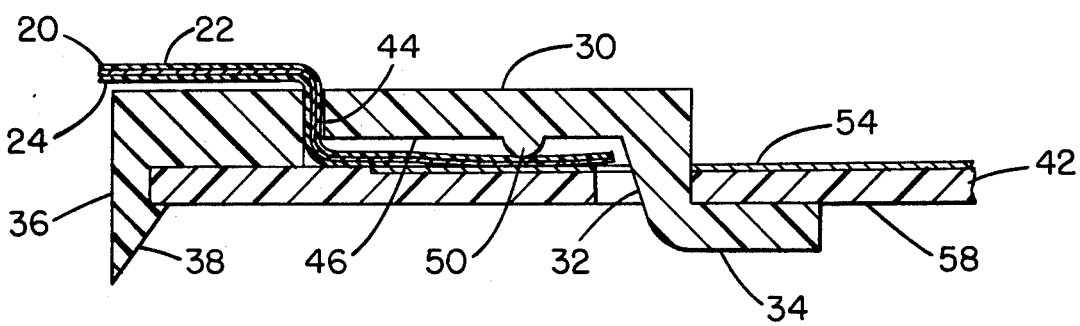

ELECTRICAL CONNECTOR

BACKGROUND OF THE INVENTION

This invention relates generally to electrical connectors and, more particularly, to connectors for electrically connecting a flat multi-conductor cable to a printed circuit board.

Prior electrical connectors for securing flat multi-conductor cable to a printed circuit board have been composed of a number of components resulting in a complex and costly connector. Other connectors have been constructed on the plug-and-socket arrangement where special fittings are required to accomplish the electrical connection. Still other types of connectors employ members which cut into or pierce the conductor in the cable. All of these prior connectors are also subject to having the cables pulled loose from the connectors, thereby requiring complex structures to provide the strain relief required and thus further adding to the cost of the connector. In addition, the preparation required of the cable and the printed circuit board in order to use these prior connectors have been quite extensive, thus further detracting from their use.

SUMMARY OF THE INVENTION

It is therefore the principal object of this invention to provide a connector for connecting a flat multi-conductor cable to a printed circuit board which is simple in its construction and use and therefore low in cost. It is a further object of this invention to provide a connector which is easily mounted on a printed circuit board while providing positive contact and proper orientation of each conductor in the cable with the conductors on the printed circuit board. It is another object of this invention to provide an electrical connector having means to provide uniform strain relief over the entire width of the cable thereby insuring against the dislodging of the cable from the connector. In order to attain these and other objects of the invention, there is provided a flat elongated support member having a plurality of front mounted tab members each having a foot portion and a plurality of latching members each of which includes a recessed area for latching the edge of the printed circuit board. The support member further includes a slot extending through the member and a rib portion located on the bottom surface of the support member. Prior to the mounting of the connector to the circuit board, the lower surface of one end of the cable is removed exposing one side of the conductors located therein. The prepared end of the cable is then inserted through the slot in the support member and along the lower surface of the support member. The tab members of the support member are then inserted within locating apertures in the printed circuit board with the foot portions engaging the lower surface of the printed circuit board. The support member is then rotated to a latching position on the printed circuit board where the edge of the circuit board is positioned within the recessed area of the latching members, the rib portion forcing the exposed conductors in the cable against the exposed conductors on the printed circuit board.

BRIEF DESCRIPTION OF THE INVENTION

FIG. 3 is a perspective view of the connector formed in accordance with the present invention.

FIG. 4 is a cross-sectional view of the connector being inserted into the printed circuit board.

FIG. 5 is a view similar to FIG. 4 showing the connector in a latched position on the printed circuit board.

DETAILED DESCRIPTION OF A PREFERRED EMBODIMENT

Figure 1:
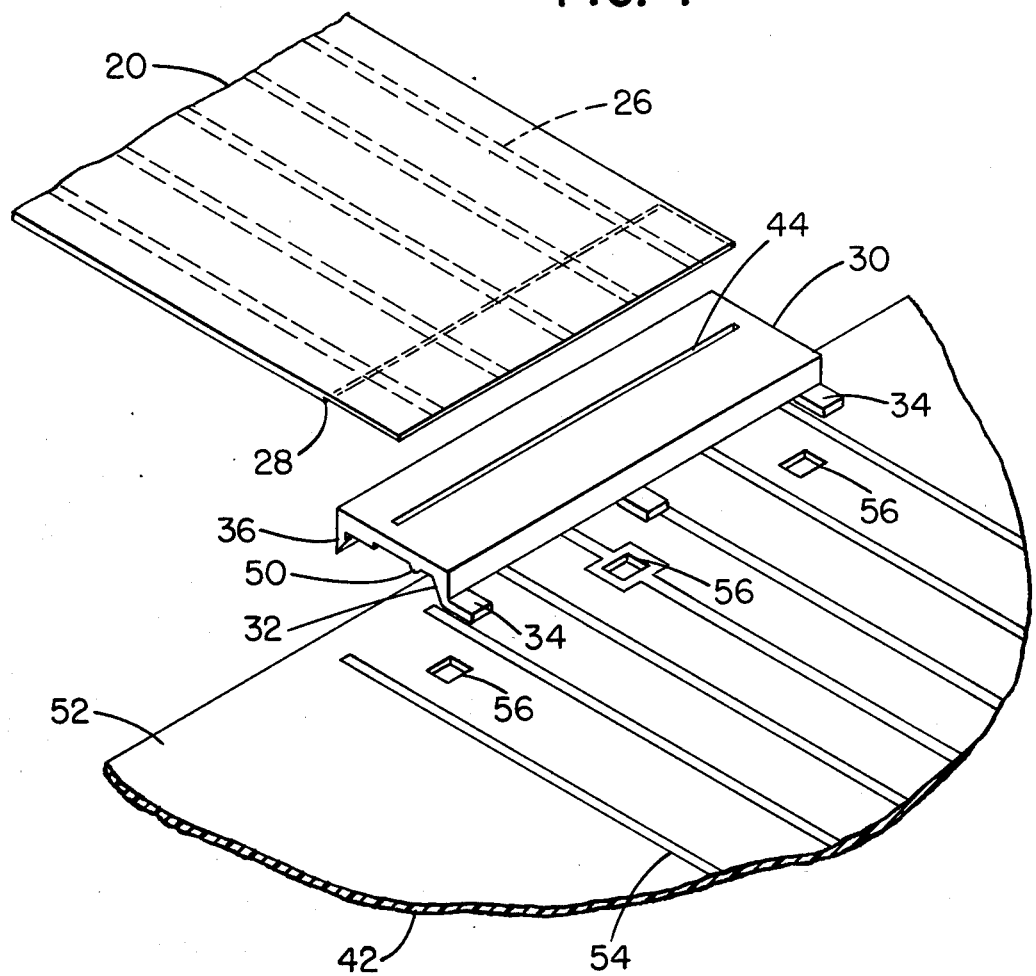
FIG. 1 is a perspective exploded view of the connector, the flat multi-conductor cable before insertion within the connector and the printed circuit board with the locating apertures for the connector.
Figure 2:
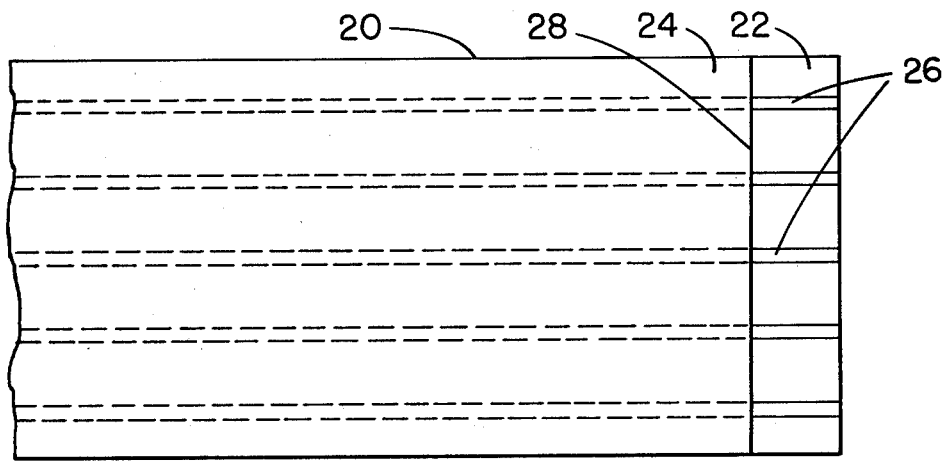
FIG. 2 is a plan view of the end of the cable showing a portion of the insulation material removed to expose one side of the conductors imbedded in the cable.

Referring now to the drawing, and more particularly to FIG. 1, there is shown a conventional flat multi-conductor cable 20 comprising upper 22 (FIGS. 4 and 5) and lower 24 layers of insulation, as for example, a polyester material such as "Mylar" manufactured by and a trademark of E. I. Du Pont de Nemours and Co., between which is sandwiched a plurality of thin parallel copper conductors 26. In order to prepare the cable for use with the connector of the present invention, it is necessary to remove a strip of insulation from one side of the cable 20 thereby exposing the conductors 26. This removal of the insulation leaves an edge 28 of the insulation on the lower surface of the cable as shown in FIGS. 1 and 2.

Figure 6:
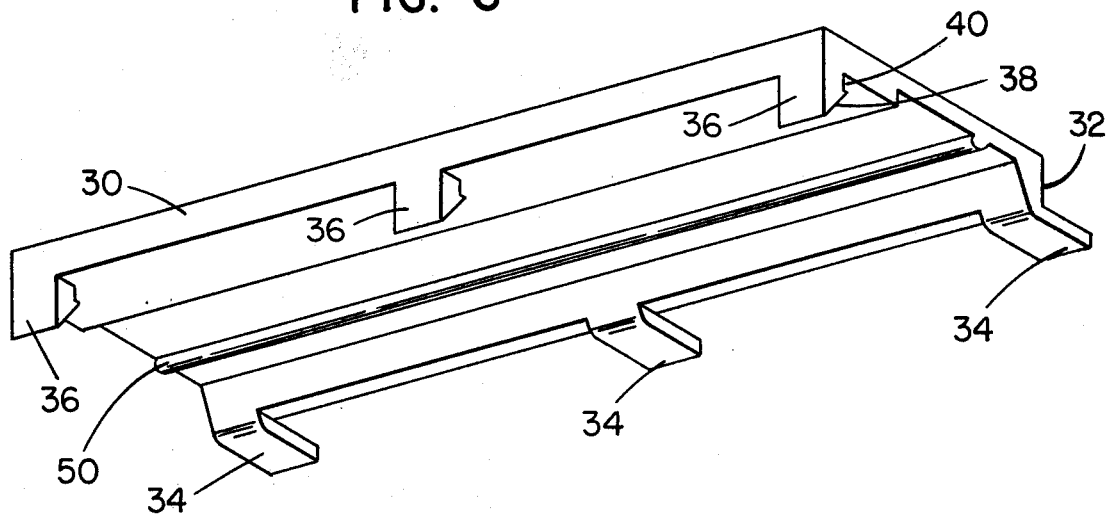
FIG. 6 is a perspective view of the connector formed in accordance with the present invention showing details of the underside of the connector.

The connector 30 (FIGS. 1 and 3) of the present invention comprises a one-piece elongated member which may be fabricated by molding or the like and is preferably constructed of any type of electrically insulating material such as Delrin, an acetal resins material manufactured by and a trademark of E. I. Du Pont de Nemours and Co. The present embodiment of the connector 30 is shown having molded at the lower front edge thereof three depending tab members 32 (FIGS. 3 and 6) each including a horizontal extending foot portion 34. At the lower rear edge of the connector 30, there are molded three depending latch fingers 36 (FIG. 6) each having a lower cam surface 38 extending at an angle of approximately 55° with a horizontal plane, the upper end of which forms one wall of a slot 40 located in the front edge of the finger 36 (see also FIG. 4). The slot 40 has a width which is equal to the thickness of the printed circuit board 42, the function of which will be described hereinafter.

Extending lengthwise in the connector 30 is a slot 44 (FIGS. 1 and 3) which is substantially equal in length to the width of the cable 20 and wide enough to accomodate the thickness of the cable 20, the slot 44 extending through the connector 30 to communicate with a lower surface 46 of the connector. As shown in FIGS. 4 and 5, the lower surface 46 is recessed from a rear lower surface 48 to accomodate the cable 20 when the connector is latched to the printed circuit board 42. Formed as part of the lower surface 46 of the connector is a rib portion 50 extending outwardly from the surface 46 and lengthwise of the connector 30. The rib portion 50 is dimensioned to press the cable 20 into engagement with the printed circuit board when the connector is mounted on the printed circuit board as will be described more fully hereinafter. As shown in FIG. 1, located on the upper surface 52 of the printed circuit board 42 are a plurality of copper conductors 54 to which the conductors 26 in the cable 20 are to be connected. Also located in the circuit board 42 are mounting apertures 56 which help mount the connector 30 to the circuit board 42 and orientate the conductors 26 in the cable 20 with respect to the conductors 54 on the circuit board.

In operation, the flat cable 20 is first assembled within the connector 30, with the end of the cable 20 which has had a portion of the insulation removed (FIG. 2) being threaded through the slot 44 and bent in a direction to extend along the lower surface 46 of the connector and adjacent the rib portion 50 (FIG. 4). The connector 30 is then mounted to the printed circuit board 42 by inserting the tab members 32 thereof through the apertures 56 in the circuit board thereby positioning the foot portions 34 of such tab members adjacent the lower surface 58 (FIGS. 4 and 5) of the circuit board 42. The connector 30 is then rotated toward the board 42 to engage the cam surfaces 38 of the latch fingers 36 with the upper corner of the edge of the circuit board. Further pressure on the connector 30 will deflect the latch fingers 36 outwardly until the edge of the circuit board snaps into the slots 40 thereby latching the connector 30 to the printed circuit board 42. This latching movement of the connector 30 will force the rib portion 50 thereof into engagement with the cable 20 and against the upper surface 52 of the printed circuit board 42 resulting in the exposed conductors 26 in the cable 20 engaging and maintained against the aligned conductors 54 on the printed circuit board thereby completing an electrical connection between the conductors.

The advantages flowing from the use of the novel connector forming the present invention will be readily apparent to those skilled in the art. The latching of the connector 30 to the printed circuit board 42 by anchoring the connector in the board apertures 56 and by engaging the edge of the printed circuit board with the fingers 36 provides a secure mounting of the connector 30 which eliminates any chance of movement of the connector on the circuit board. The mounting of the cable 20 within the slot 44 in the connector 30 together with the pressure of the rib portion 50 on the cable 20 provides the necessary strain relief which prevents any inadvertent or undesirable movement or removal of the cable with respect to the connector and the printed circuit board. It is obvious that the connector may be easily and quickly removed from the circuit board by merely bending the lower end of each of the latching fingers 36 sufficiently to release the edge of the circuit board from each of the slots 40 in the connector.

Figure 7:
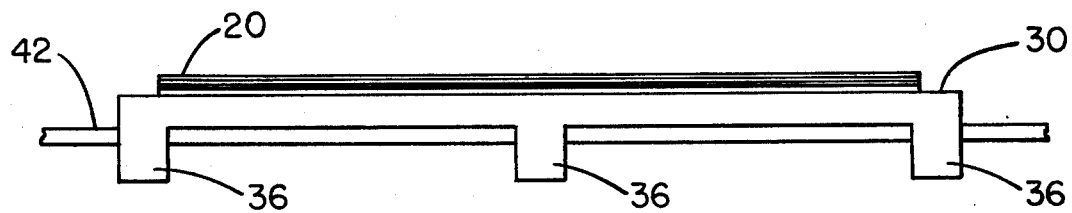
FIG. 7 is an end view of the connector shown mounted on the circuit board.

The connector 30 can be constructed to accomodate any width of cable 20 that is desired. By providing the apertures 56 in the circuit board through use of a template, extremely close tolerances can be obtained for aligning the connector on the circuit board. It is obvious from the drawing that the connector 30 is simple in its design which reduces its cost of construction to a minimum. Its low profile when mounted on the circuit board (FIG. 7) allows the connector to be used in stacks of circuit boards where space is at a premium.

While the principles of the invention have now been made clear in the illustrated embodiment, it will be obvious to those skilled in the art that many modifications of structure, arrangements, elements and components can be made which are particularly adapted for specific environments and operating requirements without departing from these principals. As an example, the latching fingers 36 may be molded as one continuous edge extension of the connector while still functioning in the manner intended. The appended claims are therefore intended to cover any such modification, within the limits only of the true spirit and scope of the invention.

What is claimed is:

1. A connector for positioning a first electrical conductor in contact with a second electrical conductor on a substrate comprising:
   a. an elongated support member having upper and lower surface portions;
   b. means extending through said upper and lower surface portions for locating a first electrical conductor from the upper surface portion of said support member to the lower surface portion of said support member;
   c. connecting means secured to the lower surface portion of said support member to rotatably connect the support member to said substrate wherein the first electrical conductor is positioned adjacent said second electrical conductor;
   d. biasing means formed in the lower surface portion of the support member and extending outwardly therefrom a predetermined distance to a position adjacent said first electrical conductor;
   e. and latch means secured to said support member and adapted to engage the edge of the substrate to releasably latch the support member to the substrate wherein said biasing means is moved, upon the latching of the support member, to a positioning biasing said first electrical conductor into a contact relation with said second electrical conductor.

2. The connector of claim 1 in which said latching means comprises a depending member having a latching portion for engaging the edge of said substrate to latch the support member to the substrate whereby said biasing means is moved in a direction to force the first conductor into engagement with the second conductor.

3. The connector of claim 2 in which said biasing means comprises a rib portion extending outwardly a distance from the lower surface of the support member whereby upon latching of said support member to the substrate, said rib portion continuously urges said first electrical conductor into engagement with said second conductor.

4. The connector of claim 2 in which said depending member is formed integrally with said support member and said latching portion comprises a recessed portion dimensioned for engaging the edge of said substrate thereby latching the support member to the substrate upon movement of the support member to a latching position.

5. A connector for effecting positive contact between the individual conductor ends of a flat multi-conductor cable and the conductors of a corresponding electrical component, comprising:
   a. a support member having upper and lower surfaces;
   b. an aperture in said support member and extending in a direction perpendicular to said upper and lower surfaces for receiving one end of said multi-conductor cable being inserted from the upper surface to a position along the lower surface of the support member;
   c. a hinge member secured to the lower surface of the support member for rotatably engaging the electrical component;

d. a biasing member depending from the lower surface of the support member to a position adjacent the conductor ends of the multi-conductor cable;

e. and a latch member depending from the lower surface of the support member opposite from the hinge member, said latch member having a latching portion for engaging the edge of the electrical component upon rotation of the support member to a position adjacent the electrical component to latch the support member to the electrical component, said biasing means biasing the conductor ends of the multi-conductor cable into engagement with the conductor of the electrical component when the support member is in said latched position.

6. The connector of claim 5 in which said latch member is integrally formed with said support member, said latching portion comprises a recessed area conforming to the dimensions of the edge of the electrical component for engaging the edge of said component for latching the support member to the component.

7. The connector of claim 5 in which said biasing member comprises an abutment portion formed on the lower surface of the support member, said abutment portion extending a distance from the lower surface of said support member whereby upon latching of the support member to the electrical component, the abutment portion will be positioned to continuously urge the conductor ends of the multi-conductor cable into engagement with the conductors in the electrical component.

8. A connector for effecting releasable contact between the individual exposed conductor ends of a flat multi-conductor cable and the electrical conductors of a printed circuit board comprising:

a. a support member having upper and lower planar surfaces;

b. an elongated slot communicating with and extending perpendicular to said first and second planar surfaces for receiving the exposed conductor end of said multi-conductor cable inserted from the upper planar surface to a position along the lower planar surface of the support member;

c. an elongated abutment member depending from the lower planar surface of said support member adjacent said slot, said abutment member extending to a position adjacent the exposed conductor ends of said multi-conductor cable;

d. a plurality of depending hinge members formed in the front portion of the lower planar surface of the support member for rotatably mounting the support member to the printed circuit board;

e. and a plurality of depending latch members formed in the rear portion of the lower planar surface of the support member, said latch members including a latching portion for latching the edge of the printed circuit board upon rotation of the support member to a position adjacent the printed circuit board to latch the support member to said board, said abutment member biasing the exposed conductor ends of said cable into contact with the conductors in said circuit board upon the latching of the support member.

9. The connector of claim 8 in which said latching portion comprises a recessed portion which engages the edge of the printed circuit board to latch the support member to the printed circuit board upon movement of the support member to a latching position.

10. The connector of claim 9 in which each of said depending latch members includes a cam surface positioned to engage the edge of the circuit board upon movement of the support member in a latching direction thereby camming the depending member in a direction to position the edge of the printed circuit board within the recessed portion.

11. A method of connecting a first electrical conductor to a second electrical conductor on a printed circuit board comprising the steps of a. threading the exposed end of the first electrical conductor through an elongated slot extending perpendicular between an upper and lower surface of a support member to a positonal adjacent the lower surface;

b. pivotally mounting one end of the support member to the printed circuit board to align the first and second electrical conductors;

c. orientating a depending rib member in the lower surface of the support member extending adjacent the slot;

d. and latching the other end of the support member to the edge of the printed circuit board to allow the rib member to force the first electrical conductor into engagement with the second electrical conductor.

12. In combination, a. a circuit board of the type comprising a sheet of insulating material having a pattern of exposed electrical conductors on one of its sides, said circuit board having selectively positioned apertures located therein;

b. a flat multi-conductor cable composed of a flexible nonconduction backing with a portion of the backing removed at one end exposing electrical conductors imbedded therein;

c. an electrical connector for securing said cable to said circuit board to engage the exposed ends of the conductors in said cable with the conductors on said circuit board, said connector comprising an elongated support member having parallel upper and lower surfaces;

d. an elongated slot extending through and orientated perpendicular to said upper and lower surfaces for receiving the exposed conductor end of said cable inserted from the upper surface to a position along the lower surface of said support member;

e. an elongated abutment member depending from the lower surface of said support member adjacent said slot, said abutment member extending to a position adjacent the exposed conductor ends of said cable;

f. hinge means located on the lower surface of said support members for insertion within said apertures for rotatably mounting said support member to said circuit board;

g. and latching means located in the lower surface of said support member opposite from said hinge means for engaging the edge of said circuit board upon rotation of said support member to a latching position on said circuit board whereby the abutment member will force the exposed conductor ends of the cable into engagement with the conductors on said circuit board.

13. The electrical connector as defined in claim 12 wherein said hinge means comprises depending foot members integrally formed in the front edge of the lower surface of said support member and positioned within said apertures to engage the lower surface of said printed circuit board for rotatably mounting the support member to the printed circuit board.

14. The electrical connector as defined in claim 12 wherein said latching means comprises a depending finger member formed on the rear edge of the lower surface of said support member and having a recessed area for latching the edge of the printed circuit board upon rotation of the support member to a latching position on said circuit board.

15. A connector for effecting releasable contact between the individual exposed conductor ends of a flat multi-conductor cable and the electrical conductors of a printed circuit board having a plurality of apertures therein comprising:

a. a flat elongated body member of resilient insulating material having upper and lower planar surfaces;

b. an elongated slot in the body member orientated in a direction perpendicular to said upper and lower planar surfaces and extending in a direction a distance equal to the width of said cable for receiving the exposed conductor ends of said cable threaded from a position adjacent the upper surface to a position adjacent the lower surface of the body member;

c. an elongated rib member formed in the lower surface of the body member and depending therefrom to a position adjacent the exposed conductor ends of said multi-conductor cable, said rib member located adjacent to and parallel with said slot;

d. a plurality of depending hinge members formed in the front portion of the lower surface for insertion through said apertures in said printed circuit board for rotatably mounting the support member to the printed circuit board;

e. and a plurality of depending finger members formed in the rear portion of the lower planar surface of the body member, said finger members including a recessed area facing said hinge member and dimensioned in accordance with the configuration of the edge of the printed circuit board for latching the edge of the circuit board upon rotation of the body member to a position adjacent the circuit board whereby said rib member will be moved to a position to force the exposed conductor ends of the cable into engagement with the electrical contuctors of the printed circuit board.

* * * * *